US005973825A

United States Patent [19]
Lasich

[11] Patent Number: 5,973,825
[45] Date of Patent: Oct. 26, 1999

[54] PRODUCTION OF HYDROGEN FROM SOLAR RADIATION AT HIGH EFFICIENCY

[76] Inventor: John Beavis Lasich, 171 Latrobe Street, Melbourne, Victoria, 3000, Australia

[21] Appl. No.: 08/854,942

[22] Filed: May 13, 1997

Related U.S. Application Data

[62] Division of application No. 08/446,582, filed as application No. PCT/AU93/00600, Nov. 25, 1993, Pat. No. 5,658,448.

[30] Foreign Application Priority Data

Nov. 25, 1992 [AU] Australia ................................ PL6021

[51] Int. Cl.[6] ............................ G02B 17/00; G02B 27/14

[52] U.S. Cl. .......................... 359/353; 359/350; 359/364; 359/365; 359/629; 359/631; 359/634

[58] Field of Search .................................... 359/353, 359, 359/364, 365, 366, 583, 584, 634, 629, 631, 633; 250/253; 136/683–685, 689, 690, 246

[56] References Cited

U.S. PATENT DOCUMENTS

| | | | |
|---|---|---|---|
| 2,552,185 | 5/1951 | Koch | 359/359 |
| 2,903,592 | 2/1959 | Bolay | 359/359 |
| 3,455,622 | 7/1969 | Cooper | 359/359 |
| 3,925,212 | 12/1975 | Tchernov | 429/111 |
| 3,993,653 | 11/1976 | Blum et al. | 204/272 |
| 4,233,127 | 11/1980 | Monahan | 204/157.1 |
| 4,278,829 | 7/1981 | Powell | 136/248 |
| 4,313,425 | 2/1982 | Crackel et al. | 429/111 |
| 4,337,990 | 7/1982 | Fan et al. | 350/1.7 |
| 4,377,154 | 3/1983 | Meckler | 136/248 |
| 4,490,981 | 1/1985 | Meckler | 136/248 |
| 4,511,450 | 4/1985 | Neefe | 204/278 |
| 4,556,277 | 12/1985 | Fan et al. | 350/1.7 |
| 4,674,823 | 6/1987 | Epstein | 350/1.7 |
| 4,700,013 | 10/1987 | Soule | 136/248 |
| 4,721,349 | 1/1988 | Fan et al. | 350/1.7 |
| 4,767,645 | 8/1988 | Linder et al. | 427/386 |
| 4,822,120 | 4/1989 | Fan et al. | 350/1.7 |
| 4,838,629 | 6/1989 | Maruyama et al. | 359/359 |
| 4,841,731 | 6/1989 | Tindell | 136/248 |
| 4,902,081 | 2/1990 | Huffer | 340/1.7 |
| 4,912,614 | 3/1990 | Goldenberg | 362/347 |
| 5,089,055 | 2/1992 | Nakamura | 136/248 |
| 5,189,551 | 2/1993 | Woodard | 359/360 |
| 5,339,198 | 8/1994 | Wheatly et al. | 359/584 |

*Primary Examiner*—Cassandra Spyrou
*Assistant Examiner*—Audrey Chang
*Attorney, Agent, or Firm*—Fish & Richardson P.C.

[57] ABSTRACT

An apparatus for separating solar radiation into a longer wavelength component and a shorter wavelength component includes a concentrator of solar radiation, the concentrator having a focal point $F_1$, and a mirror for selectively reflecting either the longer or the shorter wavelength component of the solar radiation spectrum. The mirror is positioned in the light path of solar radiation from the concentrator, the mirror having a focal point $F_2$. The mirror includes a spectrally selective filter to make the mirror transparent to the non-reflected component of the solar radiation spectrum, thereby to allow the non-reflected component to pass through the mirror to a first receiver located at the focal point $F_1$, and the mirror is appropriately curved in order to selectively concentrate and direct the reflected longer or shorter wavelength component to a second receiver located at the focal point $F_2$.

9 Claims, 5 Drawing Sheets

PRODUCTION OF HYDROGEN FROM SOLAR RADIATION AT HIGH EFFICIENCY

CROSS REFERENCE TO RELATED APPLICATION

This is a divisional of application Ser. No. 08/446,582, filed May 24, 1995, now U.S. Pat. No. 5,658,448, filed Aug. 19, 1997, which is 371 application of PCT/AU93/00600, filed on Nov. 25, 1993.

The present invention relates to a method and an apparatus for the production of hydrogen and in particular for the production of hydrogen in an electrolysis cell using solar radiation as a source of energy for the cell.

FIELD OF THE INVENTION

A present invention also relates to an apparatus for separating longer and shorter wavelength solar radiation so that the separated components of the solar radiation spectrum can be used as required in selected end-use applications, such as the production of hydrogen.

BACKGROUND OF THE INVENTION

The use of hydrogen as a carrier of energy, particularly in the context as a fuel, has the following significant technical advantages over other energy sources.

1. Supply side considerations—hydrogen is inexhaustible, storable, transportable, and has a high energy density compared with other chemical fuels.
2. Demand side considerations—hydrogen is non-polluting, more versatile than electricity, more efficient than petrol, and convertible directly to heat and electricity for both mobile and stationary applications.

By way of particular comparison, the large scale use of solar energy as an energy source has been limited for technical reasons and cost by a lack of a suitable short and long term storage medium for solar energy.

However, notwithstanding the above technical advantages of hydrogen as an energy source, the cost of production of hydrogen has been too high hitherto for widespread use as a fuel.

In the case of the production of hydrogen by electrolysis of water, a major factor in the high cost of production has been the cost of electricity to operate electrolysis cells.

In the specific case of solar radiation-generated electricity, the high cost of electricity is due in large part to the relatively low efficiency of photo voltaic (or thermal) conversion of solar energy into electricity which means that a relatively large number of photo voltaic cells (or, in the case of thermal conversion, a large collection area) is required to generate a unit output of electricity.

SUMMARY OF THE INVENTION

An object of the present invention is to provide a solar radiation based method and apparatus for producing hydrogen in an electrolysis cell which has a significantly higher efficiency and thus lower cost per unit energy produced than the known technology.

Another object of the present invention is to provide an apparatus for separating longer and shorter wavelength components of the solar radiation spectrum such that the separated components can be used efficiently.

According to a first aspect of the present invention there is provided a method of producing hydrogen comprising, converting solar radiation into thermal energy and electrical energy, and using the thermal energy and the electrical energy for producing hydrogen and oxygen by electrolysis of water.

The above first aspect of the present invention is based on the realisation that when the electrolysis process is run at high temperature (1000° C.) the electrical voltage required to maintain a given output of hydrogen can be reduced provided there is a complementary increase in thermal energy input.

The above first aspect of the present invention is based on the realisation that a significant improvement in efficiency of energy utilisation over and above a conventional electrolysis cell that is operated solely by electrical energy generated from solar radiation by a photo voltaic cell (or by thermal electrical generation methods) can be achieved by using the thermal energy produced in the generation of electrical energy, which otherwise would be regarded as a waste low temperature heat (with a cost of disposal), with the solar generated electrical energy to operate the electrolysis cell.

The above first aspect of the present invention is also based on the realisation that such waste thermal energy can only be used to advantage, in terms of efficiency of energy utilization, if that thermal energy can be transferred to the electrolysis cell and produce the high temperatures necessary to operate the electrolysis cell.

It is preferred that the method comprises separating the solar radiation into a shorter wavelength component and a longer wavelength component, and converting the shorter wavelength component into electrical energy and converting the longer wavelength component into thermal energy.

It is preferred that the method comprises, producing hydrogen and oxygen by electrolysis of water by converting water into steam and heating the steam to a temperature of at least 700° C., more preferably 1000° C., and decomposing the steam into hydrogen and oxygen in an electrolysis cell.

It is preferred that the method comprises using solar radiation generated thermal energy for converting water into steam and/or pre-heating steam and for operating the electrolysis cell and using solar radiation generated electrical energy for operating the electrolysis cell.

It is preferred particularly that the method comprises extracting thermal energy from hydrogen, oxygen, and exhaust steam produced in the electrolysis cell and using the extracted thermal energy as part of the energy component required for converting water into steam or for pre-heating steam for consumption in the electrolysis cell.

According to the first aspect of the present invention there is also provided an apparatus for producing hydrogen by electrolysis comprising, an electrolysis cell having an inlet for steam and outlets for hydrogen, oxygen, and excess steam, a means for separately converting solar radiation into thermal energy and into electrical energy arranged in series or in parallel relationship for providing the energy required for converting water into steam and/or heating steam for operating the electrolysis cell to decompose the steam into hydrogen and oxygen at high temperatures of at least 700° C., more preferably at least 1000° C.

It is preferred that the electrolysis cell be at least partially formed from materials that allow oxygen to be separated from hydrogen in and/or adjacent to the electrolysis cell.

It is preferred that the apparatus further comprises, a means for concentrating solar radiation on the thermal energy conversion means and on the electrical energy conversion means in the appropriate proportions and wavelengths.

In one embodiment, it is preferred that the electrical energy conversion means and the thermal energy conversation means be adapted for separately receiving solar radiation.

In another embodiment it is preferred that the apparatus further comprises a means for separating solar radiation into a shorter wavelength component and a longer wavelength component, wherein:

(a) the electrical energy conversion means is adapted for receiving and for converting the shorter wavelength component into electrical energy; and (b) the thermal energy conversion means is adapted for receiving and converting the longer wavelength component into thermal energy.

It is preferred that the solar radiation separating means comprises a mirror for selectively reflecting either the longer wavelength component or the shorter wavelength component of the solar radiation spectrum.

It is preferred particularly that the mirror be positioned between the solar radiation concentrating means and the electrical energy conversion means and that the mirror comprise a spectrally selective filter to make the mirror transparent to the non-reflected component of the solar radiation spectrum.

It is preferred more particularly that the mirror be adapted for selectively reflecting the longer wavelength component of the solar radiation spectrum and that the spectrally selective filter be an interference or edge filter to make the mirror transparent to the shorter wavelength component of the solar radiation spectrum.

It is preferred that the apparatus further comprises a non-imaging concentrator for concentrating the reflected longer wavelength component of the solar radiation spectrum.

It is preferred that the apparatus further comprises an optical fibre or a light guide for transferring the reflected longer wavelength component of the solar radiation spectrum to the thermal conversion means.

It is preferred that the apparatus further comprises, a heat exchange means for extracting thermal energy from hydrogen, oxygen, and exhaust steam produced in the electrolysis cell and using the extracted thermal energy as part of the energy component required for converting feed water into steam or for pre-heating steam for consumption in the electrolysis cell.

According to a second aspect of the present invention there is provided an apparatus for separating solar radiation into a longer wavelength component and a shorter wavelength component comprising, a mirror for selectively reflecting either the longer wavelength component or the shorter wavelength components of the solar radiation spectrum.

It is preferred that the mirror comprise, a spectrally selective filter to make the mirror transparent to the non-reflected component of the solar radiation spectrum.

It is preferred that the mirror be appropriately curved so that it can concentrate and direct the reflected longer wavelength component or the shorter wavelength component to a distant point for collection by a receiver.

It is preferred that the apparatus further comprises, a non-imaging concentrator for concentrating the reflected longer or shorter wavelength component.

It is preferred that the apparatus further comprises, an optical fibre of light guide for transferring the concentrated reflected longer or shorter wavelength component for use in an end use application.

It is preferred particularly that the end use application be the generation of hydrogen by electrolysis of water.

BRIEF DESCRIPTION OF THE DRAWINGS

The present invention is described further by way of example with reference to the accompanying drawings, in which.

DESCRIPTION OF PRESENTLY PREFERRED EMBODIMENTS

Figure 4:
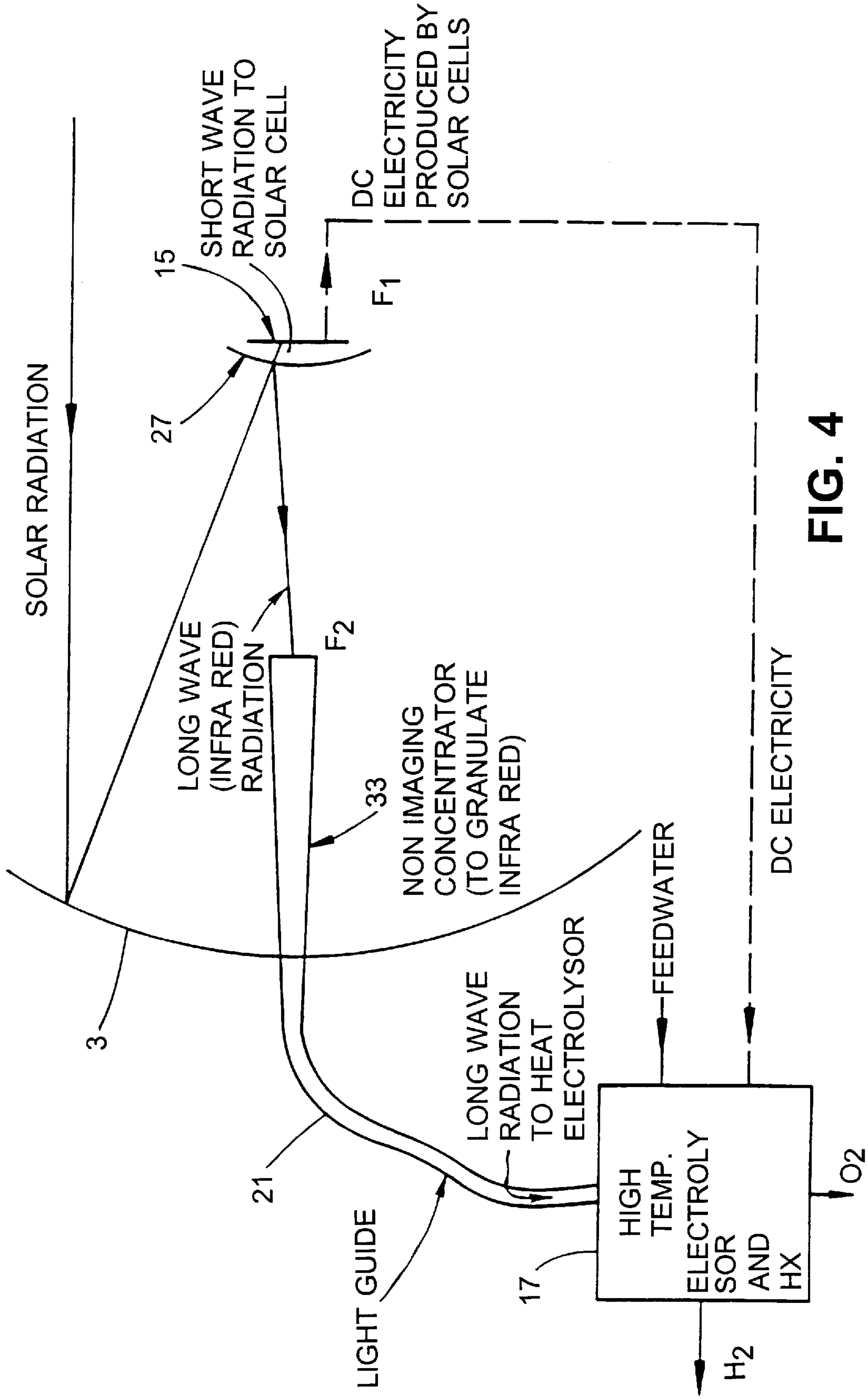
FIG. 4 illustrates schematically a further embodiment of an apparatus for producing hydrogen in accordance with the present invention.
Figure 6:
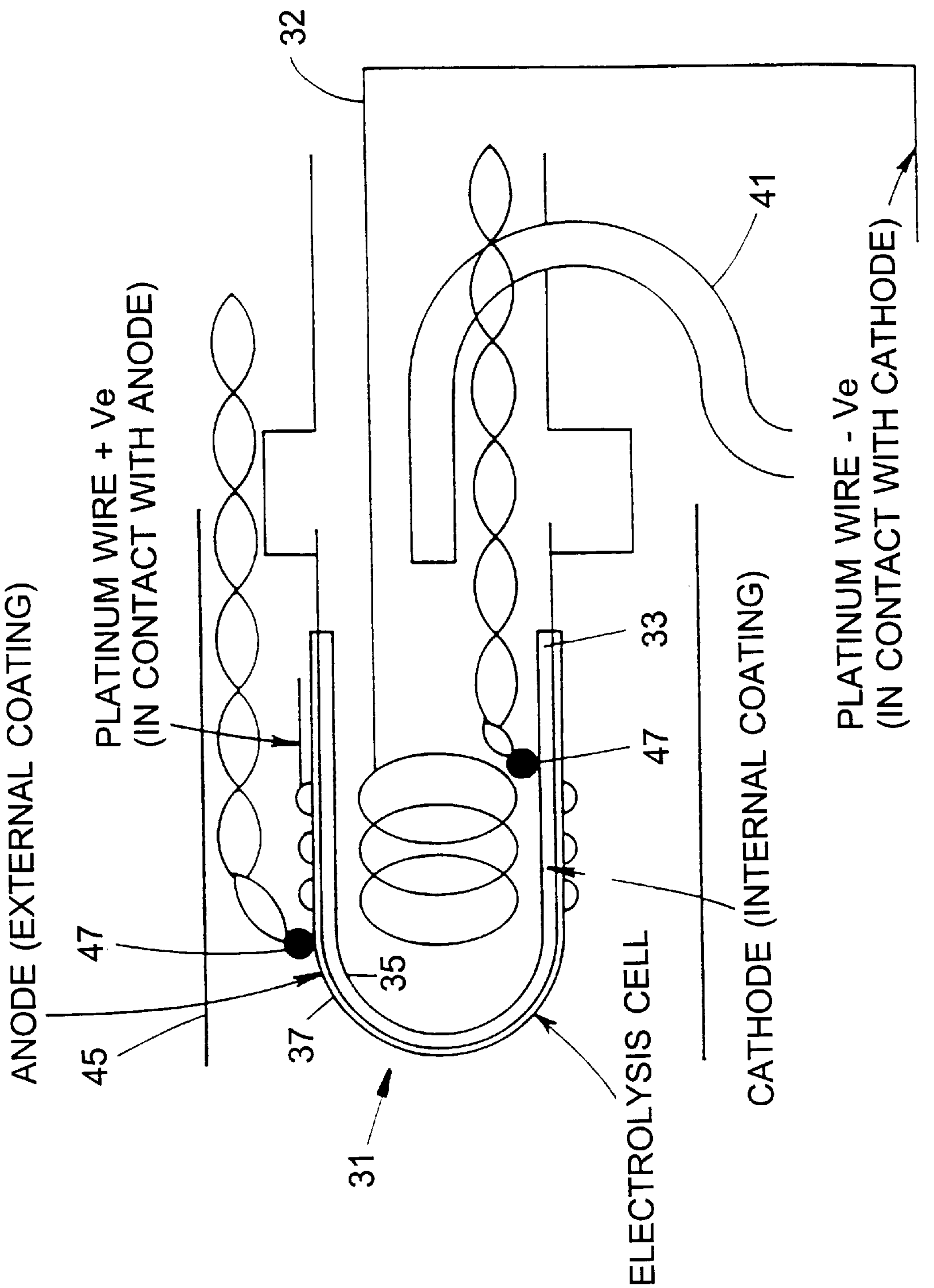

FIG. 6 is a detailed view of the electrolysis cell of the experimental test rig shown in FIG. 4.

The basis of the first aspect of the present invention is to use solar energy to provide the total energy requirements, in the form of a thermal energy component and an electrical energy component, to form hydrogen and oxygen by the electrolysis of water. In this connection, the applicant has found that the combined effect of solar-generated thermal energy and electrical energy results in a significant improvement in the is efficiency of the electrolysis of water in terms of energy utilisation, particularly when the thermal component is provided as a by-product of solar-generated electricity production.

Figure 1:
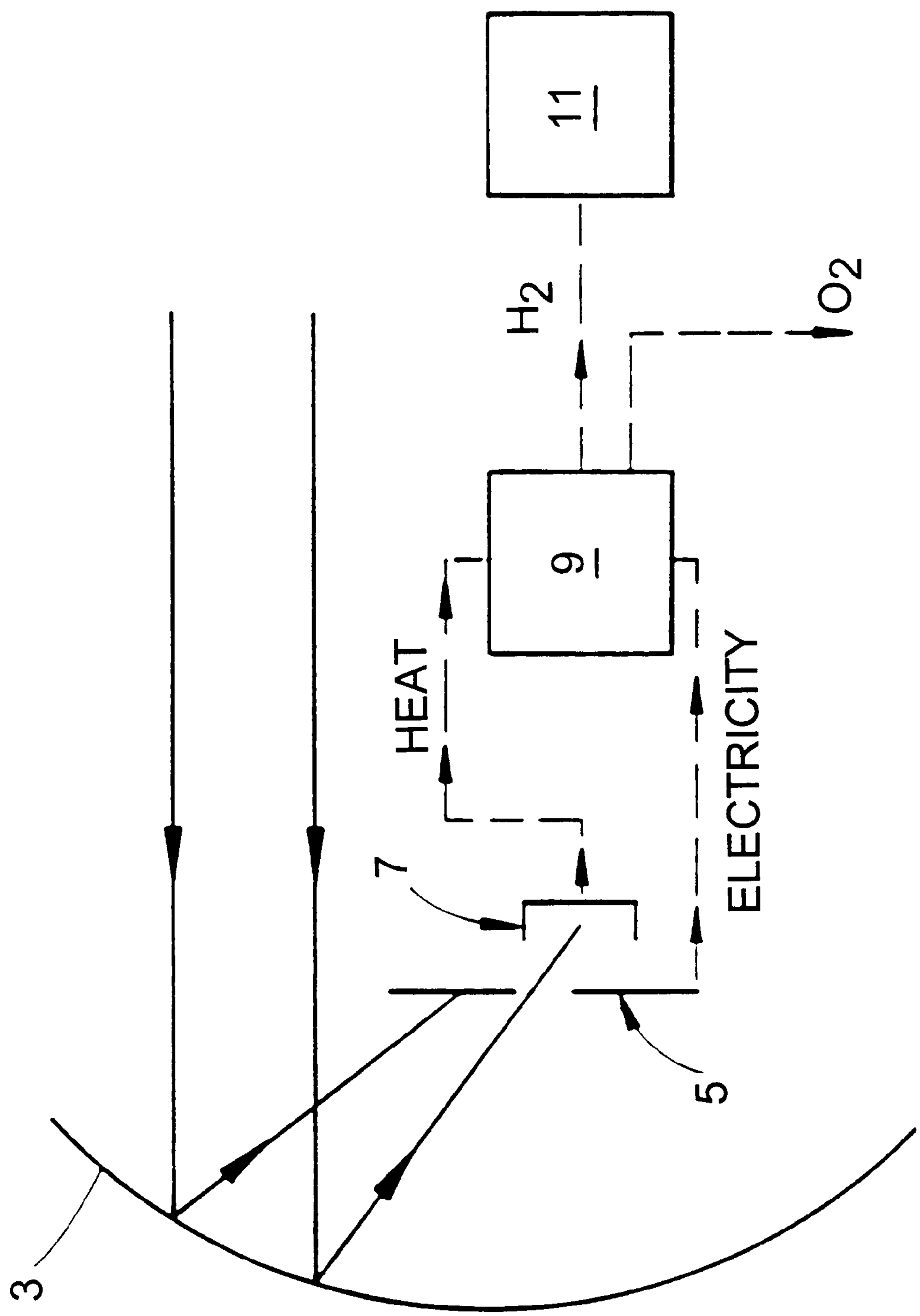
FIG. 1 illustrates schematically one embodiment of an apparatus for producing hydrogen in accordance with the present invention.

The apparatus shown schematically in FIG. 1 is in accordance with the first aspect of the present invention and comprises, a suitable form of solar concentrator 3 which focuses a part of the incident solar radiation onto an array of solar cells 5 for generating electricity and the remainder of the incident solar radiation onto a suitable form of receiver 7 for generating thermal energy.

The electricity and the thermal energy generated by the incident solar radiation are transferred to a suitable form of electrolysis cell 9 so that:

(a) a part of the thermal energy converts an inlet stream of water for the electrolysis cell 9 into steam and heats the steam to a temperature of about 1000° C.; and (b) the electrical energy and the remainder of the thermal energy operate the electrolysis cell 9 to decompose the high temperature steam into hydrogen and oxygen.

The hydrogen is transferred from the electrolysis cell 9 into a suitable form of storage tank 11.

The receiver 7 may be any suitable form of apparatus, such as a heat exchanger, which allows solar radiation to be converted into thermal energy.

The apparatus shown in FIG. 1 further comprises a heat exchanger means (not shown) for extracting thermal energy from the hydrogen and oxygen (and any exhaust steam) produced in the electrolysis cell 9 and thereafter using the recovered thermal energy in the step of converting the inlet stream of water into steam for consumption in the electrolysis cell 9. It is noted that the recovered thermal energy is at a relatively lower temperature than the thermal energy generated by solar radiation. As a consequence, preferably, the recovered thermal energy is used to preheat the inlet water, and the solar radiation generated thermal energy is used to provide the balance of the heat component required to convert the feed water or steam to steam at 1000° C. and to contribute to the operation of the electrolysis cell 9.

It is noted that the component of the thermal energy which is used endothermically at high temperature in the electrolysis cell 9 is consumed at nearly 100% efficiency. This high thermal energy utilisation is a major factor in the high overall efficiency of the system. It is also noted that high temperatures are required to achieve the high thermal energy efficiency and as a consequence only systems which can collect and deliver thermal energy at high temperatures (700° C.+) can achieve the high efficiency.

Figure 2:
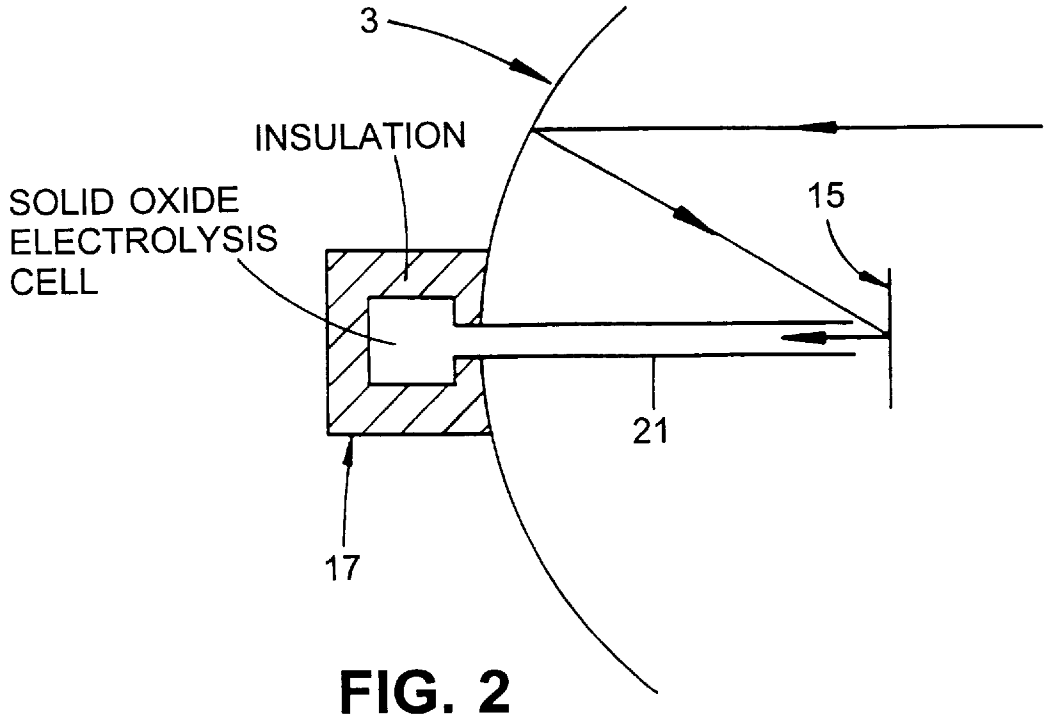
FIG. 2 illustrates schematically another embodiment of an apparatus for producing hydrogen in accordance with the present invention.
Figure 3:
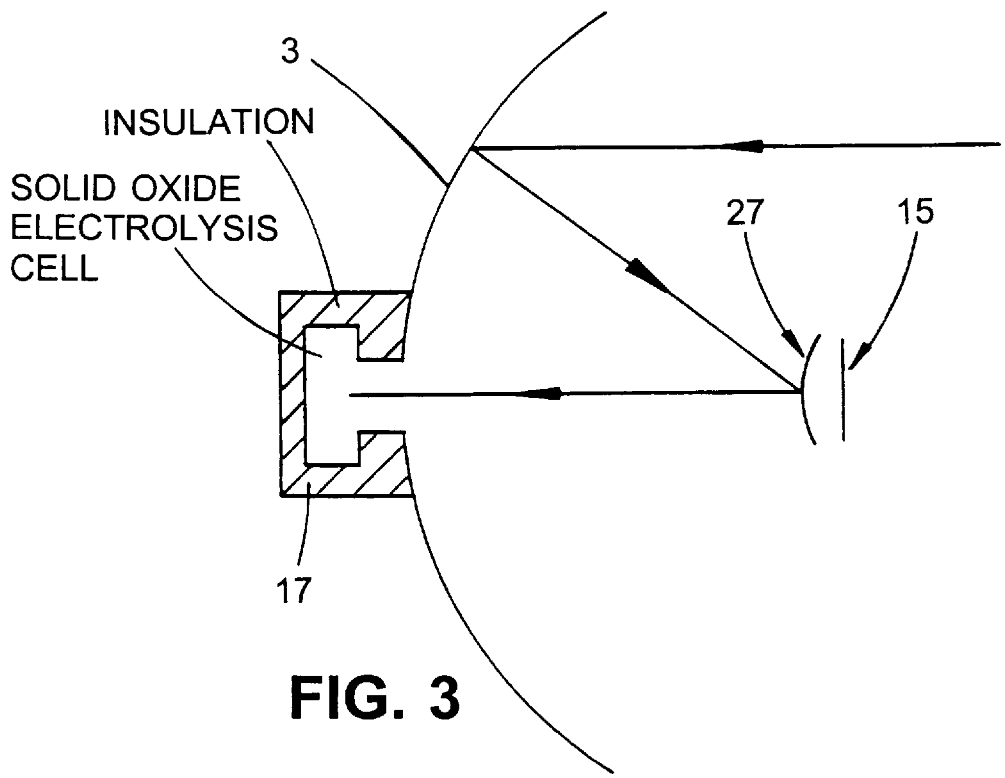
FIG. 3 illustrates schematically a further embodiment of an apparatus for producing hydrogen in accordance with the present invention.

The apparatus shown in FIG. 1 is an example of a parallel arrangement of solar cells 5 and thermal energy receiver 7 in accordance with the first aspect of the present invention. The first aspect of the present invention is not restricted to such arrangements and extends to series arrangements of solar cells 5 and thermal energy receiver 7. The apparatus shown schematically in FIGS. 2 to 4 are examples of such series arrangements. In addition, the apparatus shown schematically in FIGS. 2 to 4 incorporate examples of apparatus in accordance with the second aspect of the present invention.

The apparatus shown schematically in FIGS. 2 to 4 take advantage of the fact that solar cells selectively absorb shorter wavelengths and may be transparent to longer wavelengths of the solar radiation spectrum. In this connection, the threshold is in the order of 1.1 micron for silicon solar cells and 0.89 micron for GaAs cells leaving 25% to 35% of the incoming energy of the solar radiation, which is normally wasted, for use as thermal energy.

The apparatus shown in FIGS. 2 to 4, in terms of the first aspect of the present invention, in each case, is arranged so that, in use, solar radiation is reflected from a solar concentrator 3 onto a solar cell 15 to generate electricity from the shorter wavelength component of the solar radiation and the solar radiation that is not used for electricity generation, i.e. the longer wavelength component, is directed to a thermal energy receiver (not shown) of an electrolysis cell 17 to convert the solar radiation into thermal energy. The solar cell 15 is positioned at the focal point $F_1$ of the solar concentrator 3. The apparatus shown in FIGS. 2 to 4, in terms of the second aspect of the present invention, in each case, comprises a means which, in use, separates the longer and shorter wavelength components of the solar radiation spectrum so that the components can be used separately for thermal energy and electricity generation, respectively.

The solar radiation separating means comprises a mirror 27 (not shown in FIG. 2 but shown in FIGS. 3 and 4) positioned in front of or behind the solar cells 15 and having a focal point $F_2$ (FIG. 4).

In situations where the mirror 27 is positioned in front of the solar cells 15, as shown in FIGS. 3 and 4, the mirror 27 comprises an interference filter or edge filter (not shown) which makes the mirror 27 transparent to the shorter wavelength component of the solar radiation spectrum.

The mirror 27 may be of any suitable shape to reflect and selectively direct the longer wavelength component of the solar radiation spectrum to the focal point $F_2$. For example, in situations where the mirror 27 is positioned in front of the solar cells 15 and the focal point $F_1$ of the solar concentrator 3, as shown in FIGS. 3 and 4, the mirror 27 may take the form of a Cassigranian mirror, and in situations where the mirror 27 is positioned behind the focal point $F_1$ of the solar concentrator 3, the mirror may take the form of a Gregorian mirror.

The longer wavelength radiation reflected by the mirror 27 may be transferred to the electrolysis cell 17 by any suitable transfer means 21 such as a heat pipe (not shown) or an optical fibre (or light guide), as shown in FIGS. 2 and 4, or directly as radiation, as shown in FIG. 3.

With particular regard to the apparatus shown in FIG. 4, the electrolysis cell 17 is positioned remote from the solar cells 15, and the apparatus further comprises a non-imaging concentrator 33 for concentrating the reflected longer wavelength component of the solar radiation prior to transferring the concentrated component to the optical fibre or light guide 21.

It is also noted that the second aspect of the present invention is not limited to use of the reflected longer wavelength component of the solar radiation spectrum to provide thermal energy to an electrolysis cell and may be used to provide thermal energy in any end use application.

The electrolysis cells 9,17 shown in the figures may be of any suitable configuration. Typically, the electrolysis cells 9,17 are formed from a material, such as yttria stabilized zirconia (YSZ), which is porous to oxygen and impermeable to other gases, and the accessories, such as membranes and electrodes (not shown), are formed from materials, such as alloys and cermets.

The apparatus of the present invention as described above take advantage of the facts that:

(a) the electrical potential and the electrical energy necessary to produce hydrogen in an electrolysis cell decreases as the temperature increases and the balance of the energy requirements to operate the electrolysis cell can be provided in the form of thermal energy;

(b) the efficiency of generation of thermal energy from solar radiation is significantly higher (in the order of 3 to 4 times) than the efficiency of generation of electricity from solar radiation; and (c) the efficiency of consumption of the thermal energy endothermically in the electrolysis cell approaches 100%.

It is noted that it is believed by the applicant that the use of the by-product thermal energy can only be practically executed by the means described herein since other currently known methods are not capable of transferring energy to produce a temperature in excess of 1000° C.

In other words, a particular advantage of the present invention is that, as a consequence of being able to separate the longer and shorter wavelength components of the solar radiation spectrum, it is possible to recover and convey and use that longer wavelength component in high temperature applications where otherwise that longer wavelength component would have been converted into low temperature heat (typically less than 45° C.) and being unusable.

Further advantages of the present invention are as follows:

1. The efficiency of hydrogen production is greater than any other known method of solar radiation generated hydrogen production.
2. The present invention increases the overall efficiency of the system, i.e. the efficiency of producing hydrogen by this method is greater than the efficiency of just producing electricity.
3. The present invention provides a medium, namely hydrogen, for the efficient storage of solar energy hitherto not available economically and thus overcomes the major technological restriction to large scale use of solar energy.

It should be noted that the performance of the present invention is expected to exceed 50% efficiency.

The theoretical performance is in the order of 60%, whereas the existing technology is not expected to practically exceed 14% efficiency and has a threshold limit of 18%.

In order to illustrate the performance of the present invention the applicant carried out experimental work, as described below, on an experimental test rig shown in FIGS. 5 and 6 which is based on the embodiment of the apparatus shown in FIG. 1.

Figure 5:
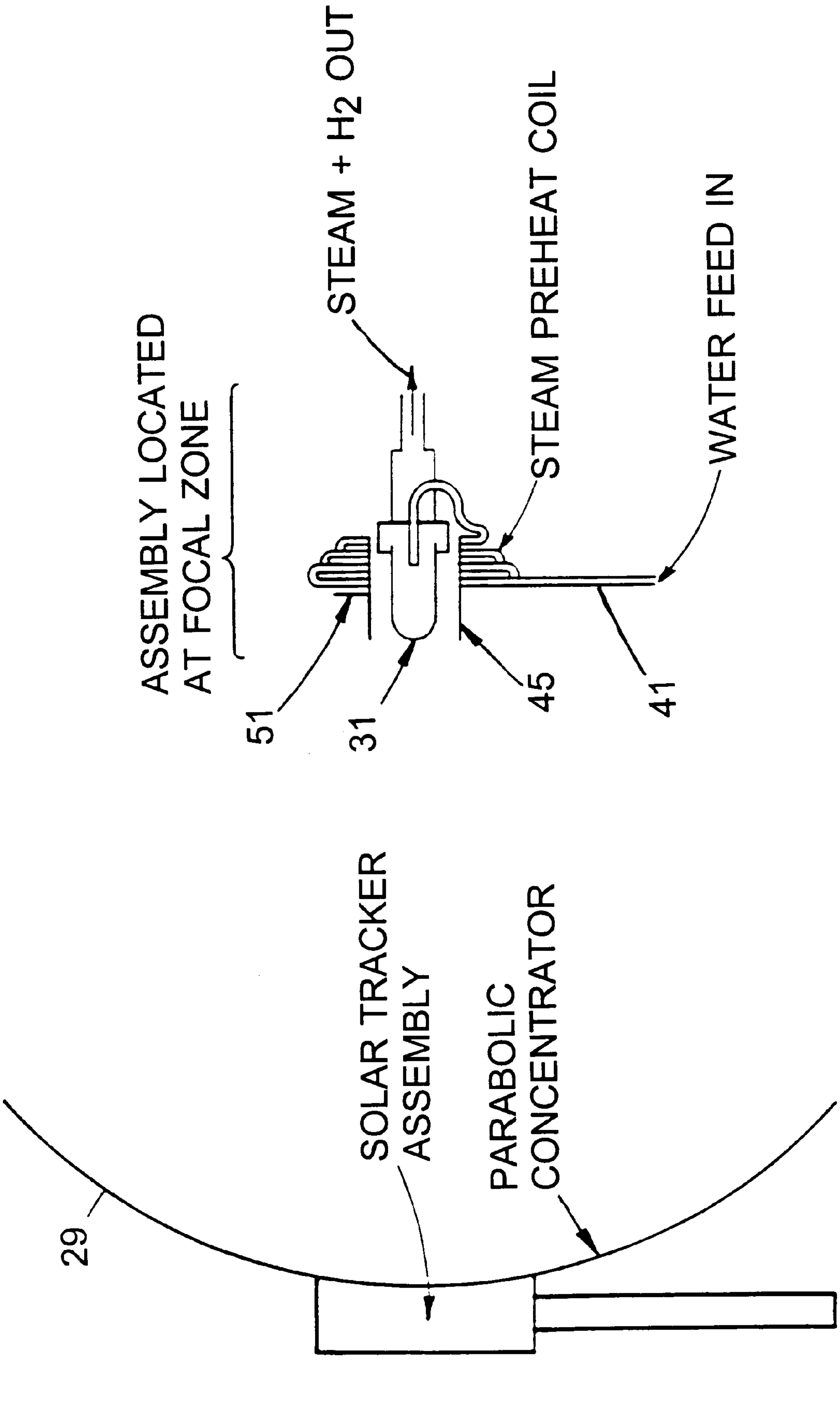
FIG. 5 is diagram which shows the major components of an experimental test rig based on the preferred embodiment of the apparatus shown in FIG. 1.

With reference to FIGS. 5 and 6, the experimental test rig comprised a 1.5 m diameter paraboloidal solar concentrating dish 29 arranged to track in two axes and capable of producing a solar radiation flux of approximately 1160 suns and a maximum temperature of approximately 2600° C. It is noted that less than the full capacity of power and concentration of the concentrating dish 29 was necessary for the experimental work and thus the receiving components (not shown) were appropriately positioned in relation to the focal plane and/or shielded to produce the desired temperatures and power densities.

The experimental rig further comprised, at the focal zone of the solar concentrating cell 29, an assembly of an electrolysis cell 31, a tubular heat shield/distributor 45 enclosing the electrolysis cell 31, a solar cell 51, and a length of tubing 41 coiled around the heat shield/distributor 45 with one end extending into the electrolysis cell 31 and the other end connected to a source of water.

The solar cell 51 comprised a GaAs photo voltaic (19.6 mm active area) concentrator cell for converting solar radiation deflected from the concentrator dish 31 into electrical energy. The GaAs photo voltaic cell was selected because of a high conversion efficiency (up to 29% at present) and a capacity to handle high flux density (1160 suns) at elevated temperatures (100° C.). In addition, the output voltage of approximately 1 to 1.1 volts at maximum power point made an ideal match for direct connection to the electrolysis cell 33 for operation at 1000° C.

With particular reference to FIG. 6, the electrolysis cell 31 was in the form of a 5.8 cm long by 0.68 cm diameter YSZ closed end tube 33 coated inside and outside with platinum electrodes 35, 37 that formed cathodes and anodes, respectively, of the electrolysis cell 31 having an external surface area of 8.3 $cm^2$ and an internal surface area of 7.6 $cm^{2.}$ The metal tube 45 was positioned around the electrolysis cell 31 to reduce, average and transfer the solar flux over the surface of the exterior surface of the electrolysis cell 31.

The experimental text rig further comprised, thermocouples 47 (FIG. 5) connected to the cathode 35 and the anode 37 to continually measure the temperatures inside and outside, respectively, the electrolysis cell 31, a 1 $mm^2$ platinum wire 32 connecting the cathode 35 to the solar cell 51, a voltage drop resistor (0.01Ω) (not shown) in the circuit connecting the cathode 35 and the solar cell 51 to measure the current in the circuit, and a Yokogawa HR-1300 Data Logger (not shown).

The experimental test rig was operated with the electrolysis cell 31 above 1000° C. for approximately two and a half hours with an excess of steam applied to the electrolysis cell 31. The output stream of unreacted steam and the hydrogen generated in the electrolysis cell 31 was bubbled through water and the hydrogen was collected and measured in a gas jar.

When a steady state was reached, readings of temperature, voltage, current and gas production were recorded and the results are summarised in Table 1 below.

| Time | Electrolysis Cell Voltage V | Electrolysis Cell Current Amps | Electrolysis Cell Temperature ° C. | Gas Production ml |
|---|---|---|---|---|
| 2.22 | 1.03 | .67 | 1020 | 0 |
| 2.39 | 1.03 | .67 | 1020 | 80 |
| net 17 minutes | | | | net 80 ml |

On the basis of the measured electrolysis cell voltage of 1.03 V recorded in Table 1 and a determined thermoneutral voltage of 1.47, the electrical efficiency of the electrolysis cell 31, calculated as the ratio of the thermoneutral and measured voltages, was $$\frac{1.47}{1.03} = 1.43$$

In terms of the solar cell efficiency, with the solar cell 31 positioned to receive a concentration ratio of 230 suns and assuming:

(a) an output voltage =1.03 (=voltage across electrolysis cell and allows for connection losses);

(b) a current of 0.67 Amps;

(c) direct solar input is 800 $w/m^{2}$; and (d) an active solar cell area $=19.6\times10^{-6}m^2$.

the efficiency of the solar cell 51 ($\eta pv$) was $$\eta pv = \frac{\text{output}}{\text{input}} = \frac{1.03\times .67}{\frac{19.6}{10^6}\times 230\times 800} = \frac{.69}{3.6} = .19$$

With a spectral reflectivity of 0.9 for the mirror surface of the solar concentrating cell 29, the efficiency of the solar concentrator dish 29 was 0.85.

Thus, the total system efficiency of the solar cell 51 and the electrolysis cell 31 and optics ($\eta$total ) was $$\eta total=0.85\times.19\times1.43=.22 \qquad (22\%)$$

The above figures of 22% is approximately twice the best previous proposed systems and more than three times the best recorded figure for a working plant.

The results of the experimental work on the experimental test rig establish that:

(a) it is possible to produce hydrogen by high temperature electrolysis of water driven totally by solar radiation, (b) the efficiency of production is greatly improved over known systems, and (c) a significant portion of the heat of solar radiation can be used directly in the electrolysis reaction thus reducing greatly expensive electrical input by almost half.

Many modifications may be made to the preferred embodiments of the present invention as described above without departing from the spirit and scope of the present invention.

By way of example, it is noted that, whilst the preferred embodiments describe methods which convert water into hydrogen and oxygen, it can readily be appreciated that the present invention is not so limited and extends to operating the methods in reverse to consume hydrogen and oxygen to produce thermal energy and electricity. In this regard, it has been found by the applicant that under certain conditions the electrical input required to produce a unit of hydrogen in accordance with the preferred embodiments of the method is less than the electrical output produced when the hydrogen is used in the methods arranged to operate in reverse and thus as well as the is system producing hydrogen the overall electrical efficiency of the plant can also be enhanced.

Furthermore, whilst the preferred embodiments describe the use of solar cells to convert solar energy into electricity, it can readily be appreciated that the present invention is not so limited and extends to any suitable solar radiation to electricity converters.

Furthermore, whilst the preferred embodiments describe that the second aspect of the present invention separates the longer and shorter wavelength components of the solar radiation spectrum by reflecting the longer wavelength component, it can readily be appreciated that the second aspect of the present invention is not limited to such an arrangement and extends to arrangements in which the shorter wavelength component is reflected.

I claim:

1. An apparatus for separating solar radiation into a longer wavelength component and a shorter wavelength component, the apparatus comprising: means for concentrating solar radiation, the means for concentrating having a focal point $F_1$; and a mirror for selectively reflecting either the longer wavelength component or the shorter wavelength component of the solar radiation spectrum, the mirror being positioned in the light path of solar radiation from the means for concentrating, the mirror having a focal point $F_2$, the mirror comprising a spectrally selective filter to make the mirror transparent to the non-reflected component of the solar radiation spectrum to allow the non-reflected component to pass through the mirror to a first receiver located at the focal point $F_1$, and the mirror being appropriately curved in order to selectively concentrate and direct the reflected longer or shorter wavelength component to a second receiver located at the focal point $F_2$.

2. The apparatus defined in claim 1 wherein the spectrally selective filter comprises an interference or edge filter.

3. The apparatus defined in claim 1 or claim 2 further comprising, a non-imaging concentrator for further concentrating the reflected longer or shorter wavelength component from the mirror.

4. The apparatus defined in claim 3 further comprising, a means for conveying the concentrated reflected longer or shorter wavelength component for use in an end use application.

5. The apparatus defined in claim 4, wherein the conveying means is an optical fibre or a light guide.

6. The apparatus defined in claim 5 wherein the end use application is the generation of hydrogen by electrolysis of water.

7. The apparatus defined in claim 5 wherein the use application is the generation of electricity for shaft power by the use of at least one of a Stirling engine, a steam heater, and a super heater.

8. The apparatus defined in claim 4 wherein the end use application is the generation of hydrogen by electrolysis of water.

9. The apparatus defined in claim 4 wherein the end use application is the generation of electricity for shaft power by the use of at least one of a Stirling engine, a steam heater, and a super heater.

* * * * *

UNITED STATES PATENT AND TRADEMARK OFFICE
CERTIFICATE OF CORRECTION

PATENT NO. : 5,973,825
DATED : OCTOBER 26, 1999
INVENTOR(S) : JOHN BEAVIS LASICH

It is certified that error appears in the above-identified patent and that said Letters Patent is hereby corrected as shown below:

Column 1, Line 7, After "U.S. Pat. No. 5,658,448," Delete "filed" and insert --issued--.

Column 4, Line 22-3, "DESCRIPTION OF PRESENTLY PREFERRED EMBODIMENTS" is misplaced. It should follow the sentence "FIG. 6 is a detailed view...shown in FIG. 4."

Column 7, Line 23, Delete "cell" and insert --dish--.

Column 9, Line 3, After "as well as the" delete "is".

Signed and Sealed this

Tenth Day of April, 2001

Attest:

Nicholas P. Godici

NICHOLAS P. GODICI

*Attesting Officer* *Acting Director of the United States Patent and Trademark Office*